(12) United States Patent
Harrabi

(10) Patent No.: US 10,381,401 B2
(45) Date of Patent: Aug. 13, 2019

(54) SPATIAL RESOLUTION AND SIMULTANEOUS MULTIPLE SINGLE PHOTON DETECTION USING SUPERCONDUCTING STRUCTURED PARALLEL NANOWIRES

(71) Applicant: King Fahd University of Petroleum and Minerals, Dhahran (SA)

(72) Inventor: Khalil Harrabi, Dhahran (SA)

(73) Assignee: King Fahd University of Petroleum and Minerals, Dhahran (SA)

( * ) Notice: Subject to any disclaimer, the term of this patent is extended or adjusted under 35 U.S.C. 154(b) by 0 days.

(21) Appl. No.: 15/898,354

(22) Filed: Feb. 16, 2018

(65) Prior Publication Data
US 2019/0051699 A1 Feb. 14, 2019

Related U.S. Application Data

(60) Provisional application No. 62/542,579, filed on Aug. 8, 2017.

(51) Int. Cl.
*H01L 27/18* (2006.01)
*H01L 39/22* (2006.01)
(Continued)

(52) U.S. Cl.
CPC ...... *H01L 27/18* (2013.01); *H01L 31/035227* (2013.01); *H01L 31/112* (2013.01);
(Continued)

(58) Field of Classification Search
CPC ............. H01L 27/18; H01L 31/035227; H01L 31/112; H01L 39/08; H01L 39/10; H01L 39/228; G01J 2001/442
(Continued)

(56) References Cited

U.S. PATENT DOCUMENTS 6,812,464 B1  11/2004  Sobolewski et al.
2004/0016883 A1  1/2004  Polonsky et al.
(Continued)

FOREIGN PATENT DOCUMENTS

CN  102353464 B  11/2012

OTHER PUBLICATIONS

Mikkel Ejrnaes, "Increasing the area coverage of superconducting nanowire single-photon detectors", SPIE, 2011, pp. 1-2, doi: 10.1117/2.1201104.003674.*

(Continued)

*Primary Examiner* — Tong-Ho Kim
(74) *Attorney, Agent, or Firm* — Oblon, McClelland, Maier & Neustadt, L.L.P.

(57) ABSTRACT

A multiple arrayed parallel nanowire device includes one or more arrays connected in series, wherein each array includes a plurality of narrow nanowires flanked by one or more wide nanowires, a top electrode, an applied current, a bottom ground electrode, and one or more lateral electrodes where one or more currents or one or more probing voltages can be applied to detect voltage changes in each array. The device detects single and multiple photons without destroying superconductivity in all the nanowires in the array and is thus capable of remaining sensitive to subsequent photon impacts. Moreover, the device can resolve the location of each photon impact.

8 Claims, 6 Drawing Sheets

(51) Int. Cl.
| | |
|---|---|
| *H01L 39/08* | (2006.01) |
| *H01L 31/112* | (2006.01) |
| *H01L 31/0352* | (2006.01) |
| *H01L 39/10* | (2006.01) |
| *G01J 1/44* | (2006.01) |

(52) U.S. Cl.
CPC .............. *H01L 39/08* (2013.01); *H01L 39/10* (2013.01); *H01L 39/228* (2013.01); *G01J 2001/442* (2013.01)

(58) Field of Classification Search
USPC .......................................................... 257/72
See application file for complete search history.

(56) References Cited

U.S. PATENT DOCUMENTS

| | | |
|---|---|---|
| 2014/0299751 A1 | 10/2014 | Tang et al. |
| 2017/0186933 A1 | 6/2017 | Sunter et al. |
| 2018/0211158 A1* | 7/2018 | Shainline ............. G06N 3/0472 |

OTHER PUBLICATIONS

M. Ejrnaes et al., "A cascade switching superconducting single photon detector", Applied Physics Letters, vol. 91, 262509 (2007).*

"Nanowire Single-Photon Detector Arrays", Massachusetts Institute of Technology Lincoln Laboratory : Lab Notes, Oct. 2012, pp. 1-4, https.//www.ll.mit.edu/publications/labnotes/nanowireophotondetector.html.

Mikkel Ejrnaes, "Increasing the area coverage of superconducting nanowire single-photon detectors", SPIE, 2011, pp. 1-2, http://spie.org/newsroom/3674-increasing-the-area-coverage-of-superconducting-nanowire-single-photon-detectors.

M. Ejrnaes, et al., "Timing jitter of cascade switch superconducting nanowire single photon detectors", Applied Physics Letters, vol. 95, 2009, pp. 1-3.

M.D. Eisaman, et al., "Invited Review Article: Single-photon sources and detectors", Review of Scientific Instruments, vol. 82, No. 071101, 2011, pp. 1-25.

M. Ejrnaes, et al., "A cascade switching superconducting single photon detector", Applied Physics Letters, vol. 91, No. 262509, 2007, pp. 1-3.

F.-R. Ladan, et al., "Current-Temperature Diagram of Resistive States in Long Superconducting Niobium Filaments", J Low Temp Phys, vol. 153, 2008, pp. 103-122.

K. Harrabi, et al., "Characterization of the current-induced resistive spots in superconducting $YBa_2Cu_3O_7$ strips", Applied Physics A, vol. 117, No. 4, 2014, pp. 2033-2036.

K. Harrabi, "Hotspot Temperatures Reached in Current-Driven Superconducting Niobium Filaments", J Supercond Nov Magn, vol. 26, Jan. 9, 2013, pp. 1865-1868.

Khalil Harrabi, "Temperature Elevation of Current-Driven Phase-Slip Centers in $YBa_2Cu_3O_7$ Strips", J Supercond Nov Magn, vol. 28, 2015, pp. 573-577.

K. Harrabi, "Temperature Dependence of the Heat Escape Time Deduced From the Nucleation of a Dissipative Zone in Superconducting $YBa_2Cu_3O_7$Filament", IEEE Transactions on Applied Superconductivity, vol. 26, No. 3, Apr. 2016, pp. 1-3.

K. Harrabi, "Resistive states created in superconducting NbTiN filaments by an electrical current pulse", AIP Advances, vol. 5, No. 037102, 2015, pp. 1-6.

K. Harrabi, et al., "Phonon Escape Time Deduced From the Time of Nucleation of Hot Spots in Superconducting Niobium Filaments", IEEE Transaction on Applied Superconductivity, vol. 26, No. 3, Apr. 2016, pp. 1-4.

* cited by examiner

SPATIAL RESOLUTION AND SIMULTANEOUS MULTIPLE SINGLE PHOTON DETECTION USING SUPERCONDUCTING STRUCTURED PARALLEL NANOWIRES

INCORPORATION BY REFERENCE

This present disclosure claims the benefit of U.S. Provisional Application No. 62/542,579, filed on Aug. 8, 2017, which is incorporated herein by reference in its entirety.

BACKGROUND

Field of the Disclosure

The present disclosure relates to single photon detection. Notably, single photon detection that resolves the spatial location of multiple photon impacts, reduces the kinetic inductance of a single photon detector device, and reduces the reset time of the detector device.

Description of the Related Art

Over the past decade, the superconducting nanowire single photon detector (SNSPD) has attracted increasing research focus due to many advantageous features for photon detection, such as sensitivity, speed, rejection of stray signals, and potential use in quantum computing. See Eisaman et al Rev. Sci. Instrum. 82(7), 071101 (2011), incorporated herein by reference in its entirety. For example, in optical quantum information technologies, individual quantum particles, such as photons, are used to encode and manipulate information.

In general, a photodetector is a device that generates an electrical signal upon absorption of light. For many nanowire-based photon detectors, one or a plurality of ultrathin and narrow nanowires are oriented on a substrate to receive incident light (photons). A superconducting nanowire single photon detector (SNSPD) is a quantum detector capable of discerning one incident photon at a time. A SNSPD can detect single photons in the visible and infrared wavelength regimes and detect these particles with a fast reset time and high efficiency over this broad spectroscopic range. See Goltsman G N, et al Appl. Phys. Lett. 79 7057 (2001); Tang H et al US20140299751A1, each incorporated herein by reference in their entirety. However, upon photon absorption, the hotspot generated by the photon renders the SNSPD unable to register additional photon impacts until it has returned to its cooled, superconducting state. See M. Ejrnaes, et al, App. Phys. Lett 95, 132503 (2009), incorporated herein by reference in its entirety.

An equilibrium state is attained by the following relaxation process: (i) electron-electron interaction and electron-phonon interaction cause inelastic scattering of quasi-particles, (ii) quasi-particles are generated by phonons, (iii) recombination of quasi-particles and (iv) generated heat escapes to the substrate by the phonon in the superconductor.

Conventional single photon detectors use a meander wire with a large kinetic inductance, which affects the rest time of the detector and could be reduced by using parallel nanowires. See M. Ejrnaes, et al Appl. Phys. Lett. 91, 262509 (2007); and C. M. Natarajan, M. G. Tanner, R. H. Hadfield, Supercond. Sci. Technol. 25, 063001 (2012), each incorporated herein by reference in their entirety.

Single photon detector fabricated by Ejrnaes et al, discusses the time jitter in parallel superconducting NbN nanowire on cascade. In addition, Ejrnaes investigated the reduction of the inductance of the nanowires.

Thus, low kinetic inductance and spatial resolution of multiple photon impacts is a desirable capability for a single SNSPD device system.

SUMMARY

Accordingly, one object of the present disclosure is to provide a single SNSPD system which overcomes the above-mentioned limitations of reset time, kinetic inductance, and spatial resolution of single and multiple photons.

In one non-limiting illustrative example, an arrayed parallel nanowire device includes an array of a plurality of narrow nanowires flanked by one or more wide nanowires, a top electrode, an applied current, an applied probing voltage, and a bottom ground electrode, where the device can be cooled below the critical temperature of the nanowire material in order to render the nanowires superconducting. Upon photon impact, a probing voltage registers a voltage change through the array, and, advantageously, the photon impact does not destroy superconductivity in the array since excess current through the impacted nanowire is redistributed to the remaining nanowires in parallel, especially the wide nanowires. This allows the array to remain sensitive to subsequent photon impacts.

In one non-limiting illustrative example, a multiple arrayed parallel nanowire device includes one or more arrays of a plurality of narrow nanowires flanked by one or more wide nanowires, a top electrode, an applied current, a bottom ground electrode, and one or more lateral electrodes where one or more currents or one or more probing voltages can be applied to detect voltage changes in each array. The device can be cooled below the critical temperature of the nanowire material in order to render the nanowires superconducting. Upon photon impact, a probing voltage applied to an associated electrode can register a voltage change through the associated array, and, advantageously, the photon impact does not destroy superconductivity in the array since excess current through the impacted nanowire is redistributed to the remaining nanowires in parallel, especially the wide nanowires. This allows the array to remain sensitive to subsequent photon impacts. Moreover, the multiple arrays can discern the impact location of the photon based on the affected array.

BRIEF DESCRIPTION OF THE DRAWINGS

A more complete appreciation of the disclosed embodiments and many of the attendant advantages thereof will be readily obtained as the same becomes better understood by reference to the following detailed description when considered in connection with the accompanying drawings, wherein.

DETAILED DESCRIPTION

Figure 1A:
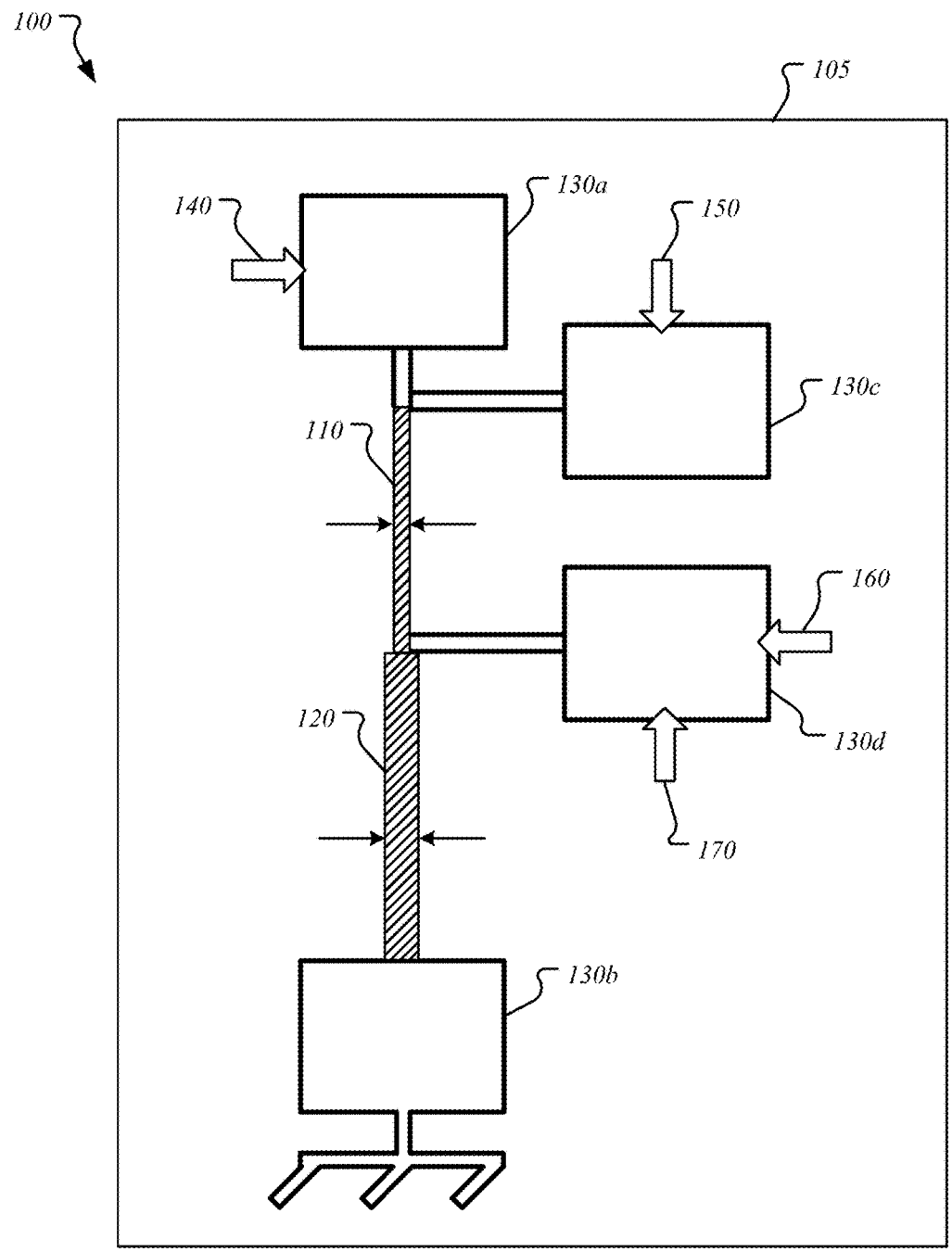
FIG. 1A is a diagram of a single photon detecting device where two superconducting nanowires in series can detect multiple photon impacts.

All publications, patent applications, patents, and other references mentioned herein are incorporated by reference in their entirety. Further, the materials, methods, and examples discussed herein are illustrative only and are not intended to be limiting.

The description set forth below in connection with the appended drawings is intended as a description of various embodiments of the disclosed subject matter and is not necessarily intended to represent the only embodiment(s). In certain instances, the description includes specific details for the purpose of providing an understanding of the disclosed embodiment(s). However, it will be apparent to those skilled in the art that the disclosed embodiment(s) may be practiced without those specific details.

It is to be understood that terms such as "left," "right," "top," "bottom," "front," "rear," "side," "height," "length," "width," "upper," "lower," "interior," "exterior," "inner," "outer," and the like that may be used herein merely describe points of reference and do not necessarily limit embodiments of the present disclosure to any particular orientation or configuration. Furthermore, terms such as "first," "second," "third," etc., merely identify one of a number of portions, components, steps, operations, functions, and/or points of reference as disclosed herein, and likewise do not necessarily limit embodiments of the present disclosure to any particular configuration or orientation.

A single photon, or energy on the order of 1 electron-volt (eV), impingent on an ultrathin nanowire in the SNSPD is able to nucleate a normal spot with increased resistance. If the nanowire is sufficiently thin, such that it is narrower than the nucleated normal spot, the normal spot will launch the bias current above the critical current, which is the current at which the nanowire will no longer be superconducting, but instead, resistive. This leads to a voltage difference or voltage spike that can be registered, followed by a relaxation process. This process entails: (i) electron-electron and electron-phonon interactions causing inelastic scattering of quasi-particles, (ii) phonons generating quasi-particles, (iii) recombination of quasi-particles, and (iv) excess heat flow to the substrate via the phonons in the superconductor. This relaxation process is affected by many factors, including nanowire thickness. For example, a single, longer nanowire with a meander pattern results in a larger kinetic inductance, whereas a series of shorter parallel nanowires could reduce the reset time.

The present disclosure implements a superconducting material, where the operating temperature is set below its transition temperature ($T_c$), where it will be superconducting. Each wire will be biased with a current slightly below its critical current ($I_{c0}$), so the array containing n nanowires requires a total bias current of $n \times I_{c01}$. See Sobolewski R, et al U.S. Pat. No. 6,812,464B1 incorporated herein by reference in its entirety. When a photon is absorbed in one nanowire, the superconductivity is locally destroyed and a normal spot is created, which forces the current to flow from both sides of the wire and forms a normal zone along the whole nanowire width and a voltage appears. Therefore, before it decays as a function of time, the current will be forced to be redistributed in the remaining (n−1) wires, and the heat escapes from the wire toward the substrate. It is followed by a current increment for each wire and forms (n−1) normal spots. In order to overcome this problem of switching the rest of the wires, a number of flanking wide nanowires, p, for example, 2, 3, 4, or any whole number, can be inserted in each array and connected in parallel to the rest of the narrow nanowires to absorb the rebalanced current.

A fundamental experiment was performed with two parallel single wires having different widths coupled off chip on two separate sapphire substrates. They were biased with an electrical current pulse with variable current amplitude. A voltage appeared after a certain delay time $t_d$ which marks the destruction of the superconductivity in the narrow wire by the induced peak. The current rebalanced to the wide parallel wire and because the second wire has a larger critical current, it will not lose superconductivity upon addition of the current from the narrow wire. The resistive state is dissolved in the narrow wire over time, and the superconducting state is recovered.

The disclosed arrayed parallel nanowire device detects single and multiple photons without destroying superconductivity in all the nanowires in the array and is thus capable of remaining sensitive to subsequent photon impacts. Moreover, the arrays can resolve the location of each photon impact.

For localizing the spatial position of the absorbed photon, two other arrays can be incorporated in series with the first array. A first array requires a biasing current $I_1 \approx (n+p)I_{c01} - \delta_1 \approx I_{c1}$, where $I_{c01}$ ($I_{c1} = nI_{c01}$) is the critical current of single wire of $W_{01}$, (here p=2) which flows through the rest of the device, including a second and third array. For the second array to be sensitive to the absorption of a second photon, the biasing current for the second array is set to be $I_2 \approx I_{c2} - I_1 - \delta_2 \approx I_{c2}$, where the critical current of the second array without including the two large laterals wires is $I_{c2}$ ($I_{c2} = (n+p)I_{c02}$, and $I_{c02}$ is the critical current of single wire of $W_{02}$, (here p=2). When the second photon is absorbed, a signal voltage appears and can be detected by a second probing voltage $V_2$. For the third array to be sensitive to the absorption of a third photon, the biasing current for the third array is set to be $I_3 \approx I_{c3} - I_1 - I_2 - \delta_3 \approx I_{c3}$ ($I_{c3} = (n+p)I_{c03}$ and $I_{c03}$ is the critical current of single wire of $W_{03}$, here p=2). When the third photon is absorbed, a signal voltage appears and can be detected by a third probing voltage $V_3$. ($\delta_1$, $\delta_2$, $\delta_3$) is the set of small current values defining the equivalent of the of energy to switch the wire.

Under this biasing condition, the disclosed device will be sensitive to simultaneous impacts of multiple photons, and the lateral probing voltages will demonstrate the appearance of voltages ($V_1$, $V_2$, $V_3$), which decay rapidly due the heat escape toward the substrate. Each array will be sensitive to the impacts of subsequent incident photons on different wires within each array.

The destruction of the superconductivity by an electrical current pulse in superconducting filament leads to the formation of dissipative states such as phase slip centers or hot spots. It has a similar role in case of wire biased with a current just below its critical current and subject to photon absorption. When a superconducting filament is biased by an electrical current pulse and once exceeding the critical current, a voltage appears after a certain delay time $t_d$. Various studies reported on different type of materials, Nb, NbTiN, YBCO. See F. R. Ladan, Kh. Harrabi, M. Rosticher, C. Villard, P. Mathieu, and J.-P. Maneval, J. Low Temp. Phys. 153, 103 (2008); K. Harrabi, AIP Advances 5, 037102 (2015); K. Harrabi, F. Oktasendra, K. Gasmi, 1 G. Berdiyorov, A. Mekki, J.-P Maneval, IEEE Trans. Appl. Supercond. (2016); K. Harrabi, IEEE Trans. Appl. Supercond. (2016); and K. Harrabi, A. F. Salem, K. Ziq, A. I. Mansour, S. Kunwar, J. P. Maneval, G. Berdiyorov, Appl. Phys. A 117, 20332036 (2014), each incorporated herein by reference in their entirety. The delay times for different applied current values were fitted with the time dependent Ginzburg Landau theory, and the heat escape time was deduced subsequently as $\tau_d$. See K. Harrabi, J. Supercond. Nov. Magn. 26, 1865 (2013), incorporated herein by reference in its entirety. It was interpreted as the time needed for the heat to escape from the filament to the substrate. It is an indication of the reset time of the photon detector to be sensitive to a second photon.

A multiple nanowire device 100 for photon detection (herein referred to as device 100) is illustrated in FIG. 1A. The device 100 is cooled below the transition temperature of the nanowire material under vacuum. A first nanowire 110 is fabricated on a substrate 105. A second nanowire 120 is connected in series to the first nanowire 110 on the substrate 105. The first nanowire 110 can be made of a superconducting material, for example niobium titanium, and can have a width of 5 micrometers. The second nanowire 120 can be made of the same superconducting material and have a width of 20 micrometers, such that its width is much wider than that of the first nanowire 110 and its critical current is higher than that of the first nanowire 120. The substrate 105 can be made of, for example, sapphire, and have dimensions of 1 centimeter by 1 centimeter, wherein a plurality of the device 100 can be fabricated on the same substrate 105. The first nanowire 110 is in contact with a top electrode 130a and the second nanowire 120 is in contact with a bottom electrode 130b. The top electrode 130a is used to bias both the first nanowire 110 and second nanowire 120 with a first current, indicated by arrow 140. The first nanowire 110 is also connected to a top lateral electrode 130c. A first probing voltage, indicated by arrow 150, can be applied to the top lateral electrode 130c in order to measure any voltage change across the first nanowire 110 and second nanowire 120. The second nanowire 120 is also connected to a bottom lateral electrode 130d. A second current, indicated by arrow 160, can be applied to the bottom lateral electrode 130d in order to additionally bias only the second nanowire 120. A second probing voltage, indicated by arrow 170, can be applied to the bottom electrode 130d in order to measure any voltage change across only the second nanowire 120.

Non-limiting examples of exemplary materials for the substrate are glass, sapphire, and magnesium oxide. Non-limiting examples of exemplary materials for the superconducting nanowire are niobium, niobium nitride, niobium titanium, niobium titanium nitride, and magnesium diboride.

Figure 1B:
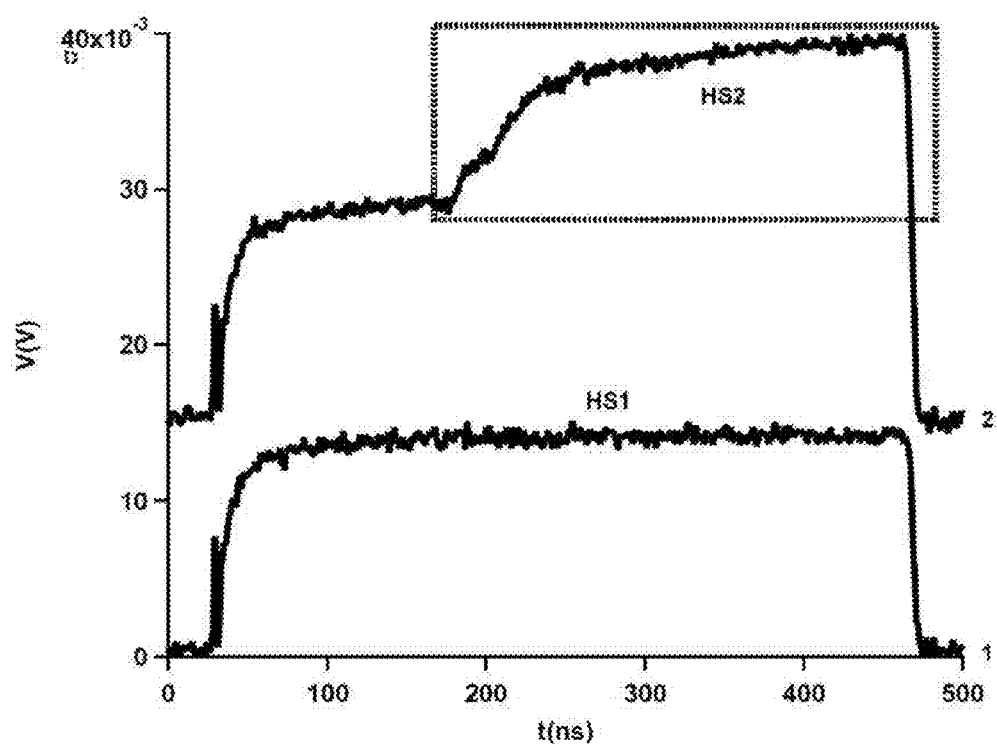
FIG. 1B is a graph consisting of traces for the device in FIG. 1A that measures the voltage drop via probing voltages and shows a normal spot formation in one then both of the nanowires.

The device 100 can be used to spatially register photon impacts, as illustrated in FIG. 1B. For example, a photon impact on the first nanowire 110 would induce a normal spot formation, thereby destroying the superconductivity of the first nanowire 110 and increasing its resistance. This would result in a voltage change that can be read by the first probing voltage 150 applied to the top lateral electrode 130c. Trace 1 in FIG. 1B demonstrates how this device registers a normal spot formation, for example by a photon impact or by increasing current through the first nanowire 110 above its critical current, via the voltage spike in this trace. However, the second nanowire 120 will remain superconducting since it is additionally biased by the second current 160. In an example where a normal spot is formed in the first nanowire 110 and the second nanowire 120, two voltage spikes can be seen, as illustrated in trace 2. A first voltage spike can be registered after a normal spot is formed, for example by a photon impact or increase in current above the nanowire's critical current at the first nanowire 110. This is illustrated by a first peak in the voltage in trace 2. Another voltage spike can be registered after a second normal spot is formed, for example by a photon impact or increase in current above the nanowire's critical current at the second nanowire 120. This is illustrated by a second peak in the voltage in the same trace 2. Therefore, device 100 and the results from the traces in FIG. 1B demonstrate resolution of one or more photon impacts at the first nanowire 110 and second nanowire 120.

Figure 2A:
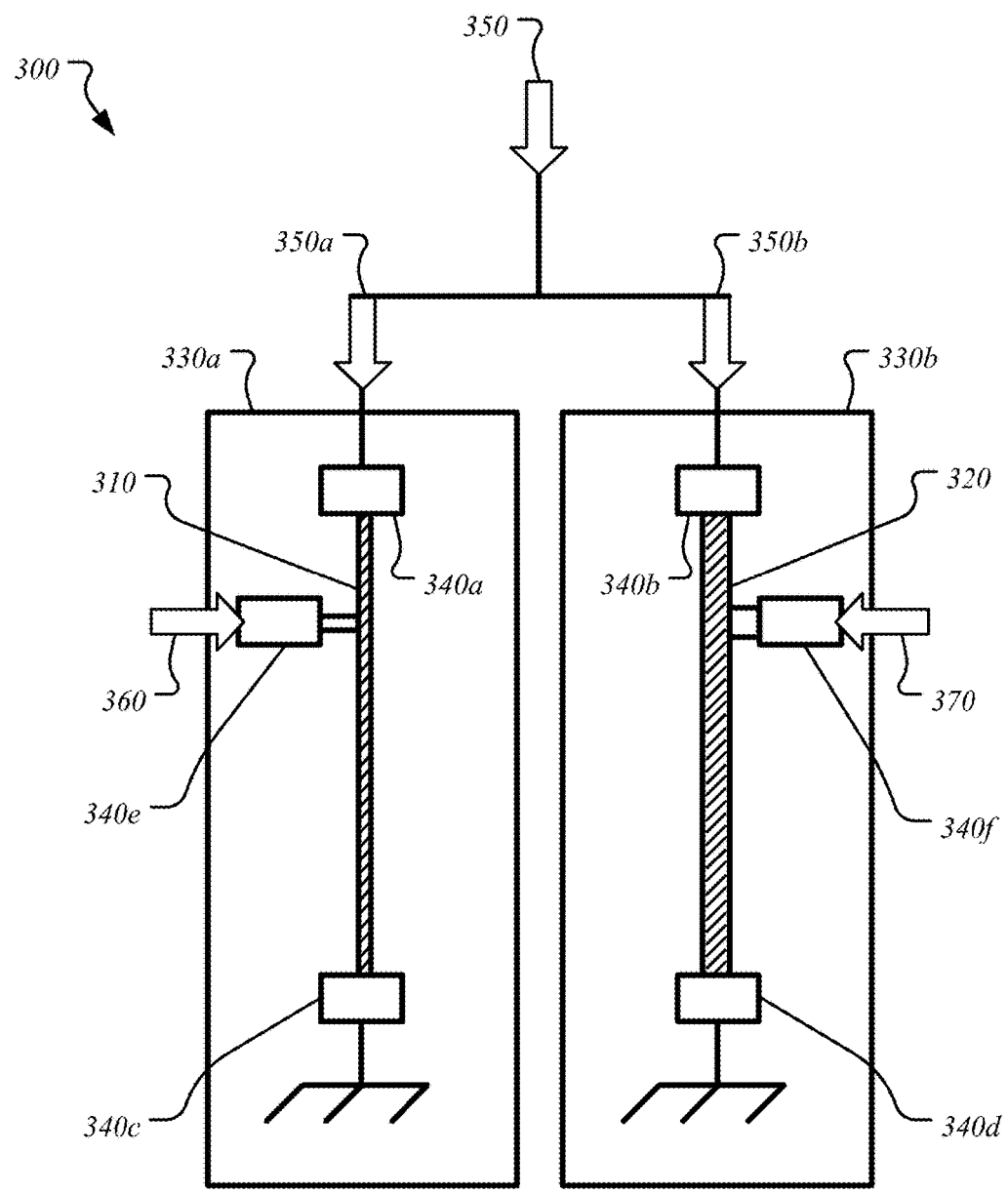
FIG. 2A is a diagram of a single photon detecting device where two superconducting nanowires in parallel demonstrate current rebalancing upon normal spot formation in one of the nanowires.

A parallel nanowire device 300 for photon detection (herein referred to as device 300) is illustrated in FIG. 2A. The device 300 is cooled below the transition temperature of the nanowire material under vacuum. A first nanowire 310 and a second nanowire 320 are fabricated on substrates 330a and 330b, respectively. The first nanowire 310 and second nanowire 320 are mounted in parallel and the width of the first nanowire 310 is less than the width of the second nanowire 320. The first nanowire 310 is in contact with a first top electrode 340a on a top end and a first bottom electrode 340c on an opposite bottom end. The second nanowire 320 is in contact with a second top electrode 340b on a top end and a second bottom electrode 340d on an opposite bottom end. The first nanowire 310 is biased with a first current, indicated by arrow 350a. The second nanowire 320 is biased with a second current, indicated by arrow 350b, where the first current 350a and second current 350b can be different in value depending on the nanowire properties. The first nanowire 310 can be connected to a first lateral electrode 340e where a first probing voltage 360 can be applied to measure any voltage change across the first nanowire 310. The second nanowire 320 can be connected to a second lateral electrode 340f where a second probing voltage 370 can be applied to measure any voltage change across the second nanowire 320.

Non-limiting examples of exemplary materials for the substrate are glass, sapphire, and magnesium oxide. Non-limiting examples of exemplary materials for the superconducting nanowire are niobium, niobium nitride, niobium titanium, niobium titanium nitride, and magnesium diboride.

The parallel nanowire device demonstrates how current in the device can be rebalanced from the thinner first nanowire 310 into the wider second nanowire 320. For example, upon photon impact on the first nanowire 310, a normal spot forms in the first nanowire 310. This destroys the superconductivity of the first nanowire 310 and increases its resistance, thereby causing the first current 350a to be rebalanced into the second nanowire 320. If the second current 350b flowing to the second nanowire 320 is sufficiently lower than its critical current, the addition of the first current 350a will not destroy the superconductivity of the second nanowire 320. After the superconductivity of the first nanowire 350a is restored via the relaxation process, it will return to its original state and regain sensitivity to photon impacts.

Figure 2B:
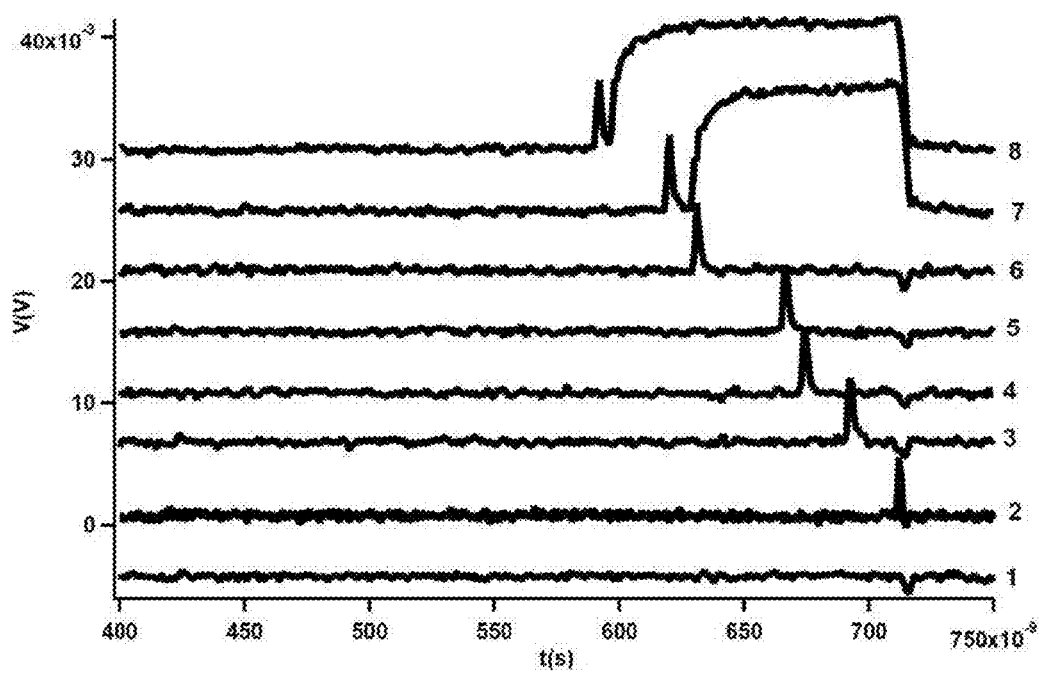
FIG. 2B is a graph consisting of traces for the device in FIG. 2A upon increasing current through one of the nanowires until a normal spot is formed.

The graph in FIG. 2b illustrates the signal output of parallel nanowire device 300. For example, at rest, the probing voltage 360 does not register any signals, which is seen in curve 1. Upon an increase in a total current, indicated by arrow 350, and thus an increase in the first current 350a, the current exceeds the critical current and a voltage is registered by probing voltage 360. This registered signal is seen as the peak in curves 2-6. Following this increase in the first current 350a and a subsequent output signal due to the formation of a normal spot, the first current 350a is balanced into the second nanowire 320 where the second current 350b is set below the critical current. If the second current 350b is set close to the critical current and the rebalanced first current 350a from the first nanowire 310 causes the total current flowing through the second nanowire 320 to exceed the critical current, curves 7 and 8 illustrate how a first peak will be exhibited from the first induced normal spot in the first nanowire 310 followed by a second extended peak from the second induced normal spot in the second nanowire 320. Therefore, the second applied current 350b to the second nanowire 320 should be sufficiently below the critical current in order for it to accept rebalanced current from induced normal spots from the first nanowire 310.

Figure 3:
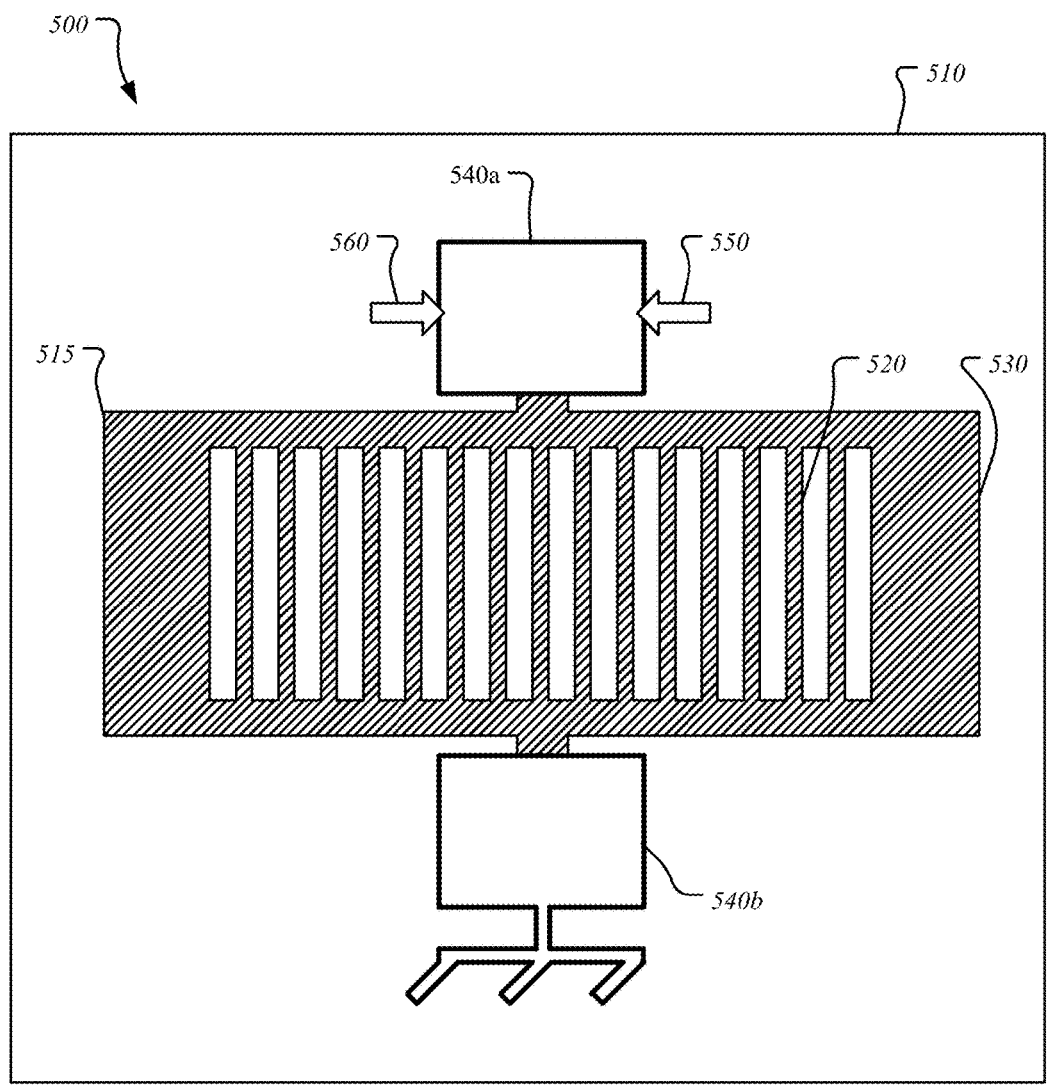
FIG. 3 is a diagram of a single arrayed parallel nanowire device for photon detection, according to certain aspects of the disclosure.

In one embodiment, an arrayed parallel nanowire device 500 (herein referred to as device 500) can be used for photon detection as illustrated in FIG. 3. This design draws on the advantages of device 100 and device 300 and marries them into an arrayed structure. A nanowire array 515 can include one or more narrow nanowires 520 connected in parallel. The nanowire array 515 can also include one or more wide nanowires 530 connected in parallel. The one or more narrow nanowires 520 can be disposed between the wide nanowires 530, where they are all connected in parallel. The device also includes a substrate 510, a top electrode 540a, a bottom electrode 540b, an applied current indicated by arrow 550, and a probing voltage indicated by arrow 560.

The narrow nanowires 520 can have lateral widths varying between, for example, 10 nanometers to 500 nanometers, or preferably, 100 nanometers to 300 nanometers. The wide nanowires 530 can have lateral widths varying between, for example, 500 nanometers to 100 micrometers, or preferably, 0.5 micrometers to 10 micrometers. The thickness of the narrow nanowires 520 and wide nanowires 530 can vary between, for example, 0.5 nanometers to 50 nanometers, or preferably, 5 nanometers to 10 nanometers. The narrow nanowires 520 in the nanowire arrays 515 can be of a uniform width or thickness in each array or be of varying widths or thicknesses in each array.

Non-limiting examples of exemplary materials for the substrate are glass, sapphire, and magnesium oxide. Non-limiting examples of exemplary materials for the superconducting nanowire are niobium, niobium nitride, niobium titanium, niobium titanium nitride, and magnesium diboride.

Figure 4:
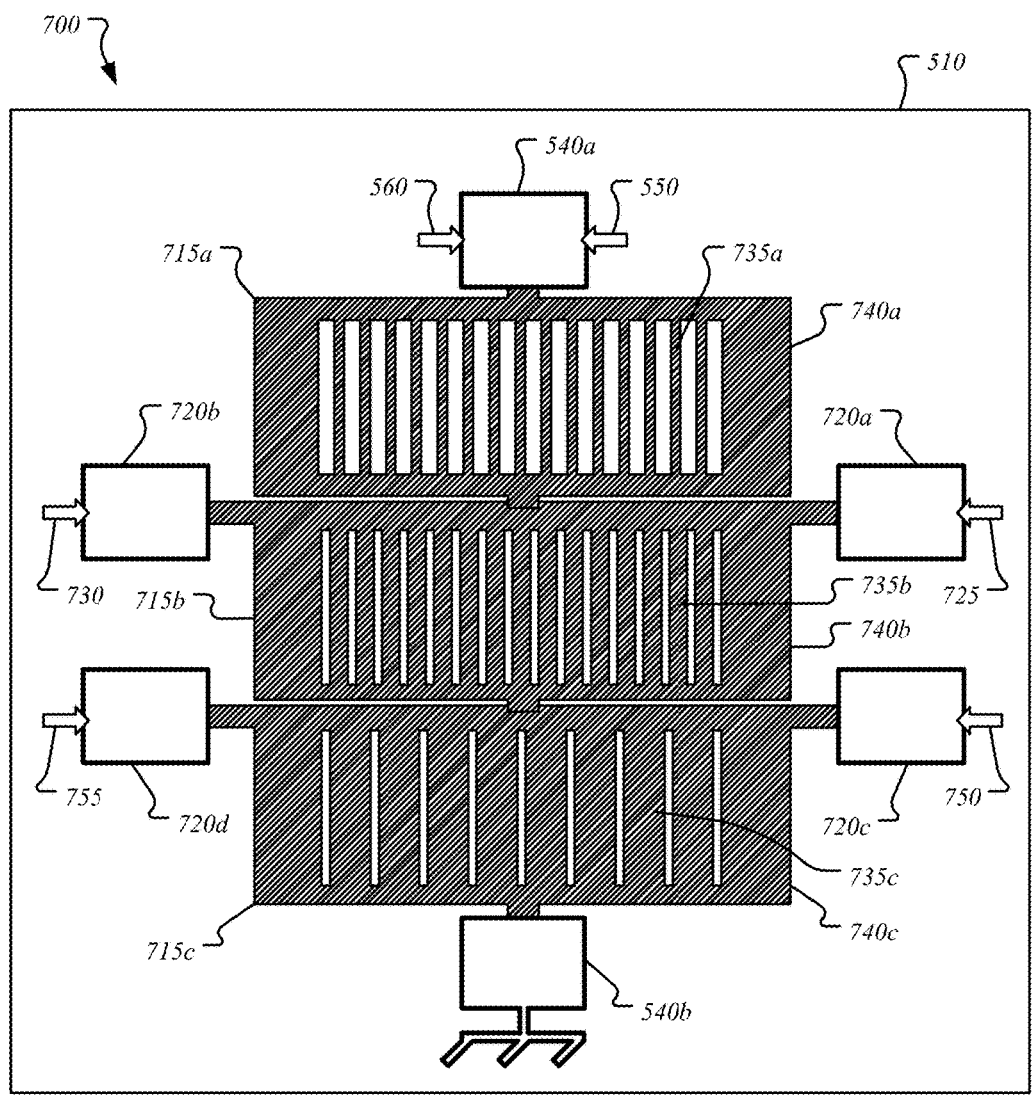
FIG. 4 is a diagram of a multiple arrayed parallel nanowire device for photon detection, according to certain aspects of the disclosure.

In an exemplary embodiment, a multiple arrayed parallel nanowire device 700 (herein referred to as device 700) can be used for multiple photon detection and spatial resolution of photon impacts. As illustrated in FIG. 4, the device adopts the nanowire array 515 design from FIG. 3. A first nanowire array 715a includes one or more narrow nanowires 735a connected in parallel. The first nanowire array 715a can also include one or more wide nanowires 740a connected in parallel. The one or more narrow nanowires 735a can also be disposed between the wide nanowires 740a, where they are all connected in parallel. The device also includes a substrate 510, a top electrode 540a, a bottom electrode 540b, a first applied current indicated by arrow 550, and a first probing voltage indicated by arrow 560. Additional arrays can be connected in series to the first nanowire array 715a. For example, a second nanowire array 715b can be connected to a bottom side of the first nanowire array 715a, and a third nanowire array 715c can be connected to a bottom side of the second nanowire array 715b. The top electrode 540a can be connected to the first nanowire array 715a and the bottom electrode 540b can be connected to the third nanowire array 715c.

A first right lateral electrode 720a can be connected to the second nanowire array 715b on a right side of the second nanowire array 715b. A first left lateral electrode 720b can be connected to the second nanowire array 715b on a left side of the second nanowire array 715b. A second applied current, indicated by arrow 725, is applied to the second nanowire array 715b, and a second probing voltage, indicated by arrow 730, can be applied to measure any voltage change across the second nanowire array 715b.

A second right lateral electrode 720c can be connected to the third nanowire array 715c on a right side of the third nanowire array 715c. A second left lateral electrode 720d can be connected to the third nanowire array 715c on a left side of the third nanowire array 715c. A third applied current, indicated by arrow 750, is applied to the third nanowire array 715c, and a third probing voltage, indicated by arrow 755, can be applied to measure any voltage change across the third nanowire array 715c. While the device as presented in this embodiment consists of 3 arrays, this design can be repeated for any number of similar nanowire arrays 515 connected in series.

The narrow nanowires 735a, 735b, 735c and wide nanowires 740a, 740b, 740c can have widths and thicknesses similar to those as device 500. Further, the narrow nanowires 735a, 735b, 735c in the first, second, and third nanowire arrays 715a, 715b, 715c can be of a uniform width or thickness in each array or be of varying widths or thicknesses in each array. For example, the wide nanowires 740a, 740b, 740c can all have a width of 10 micrometers, while the narrow nanowires 735a in the first nanowire array 715a can have a width of 100 nanometers, the narrow nanowires 735b in the second nanowire array 715b can have a width of 150 nanometers, and the narrow nanowires 735c in the third nanowire array 715c can have a width of 200 nanometers. The substrate 510 can be made of, for example, sapphire, and have dimensions of 1-10 centimeter by 1-10 centimeter, wherein a plurality of the device 700 can be fabricated on the same substrate 510. The narrow nanowires 735a, 735b, 735c and wide nanowires 740a, 740b, 740c can be made of niobium nitride and the substrate can be made of sapphire. Further non-limiting examples of exemplary materials for the substrate are glass and magnesium oxide. Further non-limiting examples of exemplary materials for the superconducting nanowire are niobium, niobium titanium, niobium titanium nitride, and magnesium diboride.

There are many advantages to device 500 and device 700. They can reduce kinetic inductance and the reset time of the normal spot. For example, upon photon impact somewhere in the middle of the first nanowire array 715a and absorption by one of the narrow nanowires 735a, a normal spot is created and superconductivity is locally destroyed in the impacted narrow nanowire 735a. Moreover, this event can be detected by probing voltage 560 to indicate that a photon impact has occurred. This increase in resistance of the narrow nanowire 735a leads to current redistribution into the remaining narrow nanowires 735a in the first nanowire array 715a. The flanking wide nanowires 740a will help absorb a majority of the current redistribution from the narrow nanowire 735a that absorbed the photon, preventing the remaining narrow nanowires 735a from losing superconductivity. Thus, this capability allows the same array to remain sensitive to upcoming photon impacts. Additionally, the length of the narrow nanowires 735a and wide nanowires 740a can easily be adjusted during fabrication in order to increase area of coverage in a single array, such as the first nanowire array 715a.

Area coverage can also be increased via the design of device 700, which can detect multiple photon impacts while also spatially resolving the impact locations. For example, for an impact of a first photon on the first nanowire array 715a, a positive voltage is detected by the first probing voltage 560. In addition, a negative voltage is detected by the second probing voltage 730 due to the first photon impact. In the case where a second photon impact occurs on the second nanowire array 715b, a positive voltage is detected by the second probing voltage 730, a negative voltage is detected by the third probing voltage 755, and an additional positive voltage is detected by the first probing voltage 560. Therefore, both the first and second photon impacts are detected, and in a similar extension, a third photon impact could be detected by the third nanowire array 715c. Again, since the design of nanowire arrays 735a, 735b, 735c feature wide nanowires 740a, 740b, 740c flanking narrow nanowires 735a, 735b, 735c, none of the arrays will lose superconductivity and each array can remain sensitive to additional photon impacts immediately after registering the previous photon impact.

These advantages lead to benefits in many applications, such as quantum imaging, quantum entanglement, quantum cloning, Geiger-mode LiDAR, and low light metrology. For example, the multiple arrays in device 700 will allow for spatial resolution of each photon impact, effectively increasing "pixel" resolution. In another example, the ability to quickly count photons without requiring time to reset superconductivity allows for improved efficiency in photon scanners.

While certain embodiments have been described, these embodiments have been presented by way of example only, and are not intended to limit the scope of the present disclosures. Indeed, the novel methods, apparatuses and systems described herein can be embodied in a variety of other forms; furthermore, various omissions, substitutions and changes in the form of the methods, apparatuses and systems described herein can be made without departing from the spirit of the present disclosure. The accompanying claims and their equivalents are intended to cover such forms or modifications as would fall within the scope and spirit of the present disclosure.

What is claimed is:

1. An arrayed parallel nanowire device, comprising:
a substrate;
an array including a plurality of nanowires connected in parallel disposed on the substrate; and
a source electrode and a ground electrode connected to the array and configured to conduct a current from the source electrode through the array to the ground electrode, wherein
the array is configured to detect one or more photon impacts;
the array includes a first set of a plurality of nanowires disposed in an interior of the array and a second set of a plurality of nanowires disposed on a periphery of the array;
a width of the nanowires in the first set is narrower than a width of the nanowires in the second set; and
each of the plurality of nanowires of the first set is electrically connected in parallel to each of the plurality of nanowires of the second set.

2. The arrayed parallel nanowire device of claim 1, wherein the first set of the plurality of nanowires has a width of approximately 100 nanometers and a thickness of approximately 5 nanometers.

3. The arrayed parallel nanowire device of claim 1, wherein the second set of the plurality of nanowires has a width of approximately 1 micrometer and a thickness of approximately 5 nanometers.

4. The arrayed parallel nanowire device of claim 1, wherein a material of the plurality of nanowires includes at least one of niobium, niobium nitride, niobium titanium, niobium titanium nitride, and magnesium diboride.

5. The arrayed parallel nanowire device of claim 1, wherein a material of the substrate includes at least one of glass, sapphire, and magnesium oxide.

6. The arrayed parallel nanowire device of claim 1, further comprising an additional plurality of arrays connected in series, wherein each one of the additional plurality of arrays is connected to one or more lateral electrodes that are configured to receive a current or probing voltage.

7. The arrayed parallel nanowire device of claim 6, wherein the one or more photon impacts is detected via a change in the current or probing voltage at each respective additional plurality of arrays.

8. The arrayed parallel nanowire device of claim 1, wherein
the current conducted from the source electrode through the array to the ground electrode at least partially conducts through at least one of the nanowires in the first set of the plurality of nanowires disposed in the interior of the array; and
in response to one of the nanowires in the first set of the plurality of nanowires disposed in the interior of the array losing superconductivity when impacted by the one or more photon impacts, the current is redirected at least partially into the second set of the plurality of nanowires disposed on the periphery of the array.

* * * * *